(12) United States Patent
Moosbrugger et al.

(10) Patent No.: US 7,492,325 B1
(45) Date of Patent: Feb. 17, 2009

(54) MODULAR ELECTRONIC ARCHITECTURE

(75) Inventors: Peter J. Moosbrugger, Erie, CO (US); Tim Meenach, Thornton, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 292 days.

(21) Appl. No.: 11/242,806

(22) Filed: Oct. 3, 2005

(51) Int. Cl.
*H01Q 21/00* (2006.01)
*H01Q 3/26* (2006.01)

(52) U.S. Cl. ........................................ 343/853; 342/373

(58) Field of Classification Search ................. 333/103, 333/156, 161; 343/700 MS, 853; 342/371–373; 361/728, 736, 748, 760, 784
See application file for complete search history.

(56) References Cited

U.S. PATENT DOCUMENTS

| | | | |
|---|---|---|---|
| 4,056,792 A * | 11/1977 | Horwitz et al. | 333/156 |
| 4,599,585 A * | 7/1986 | Vorhaus et al. | 333/164 |
| 4,791,421 A | 12/1988 | Morse et al. | |
| 4,829,309 A | 5/1989 | Tsukamoto et al. | |
| 4,888,597 A | 12/1989 | Rebiez et al. | |
| 5,008,496 A | 4/1991 | Schmidt et al. | |
| 5,121,297 A | 6/1992 | Haas | |
| 5,144,534 A | 9/1992 | Kober | |
| 5,235,736 A | 8/1993 | Hahs, Jr. et al. | |
| 5,428,190 A | 6/1995 | Stopperan | |
| 5,434,362 A | 7/1995 | Klosowiak et al. | |
| 5,452,182 A | 9/1995 | Eichelberger et al. | |
| 5,675,345 A | 10/1997 | Pozgay et al. | |
| 5,838,285 A | 11/1998 | Tay et al. | |
| 5,903,440 A | 5/1999 | Blazier et al. | |
| 6,020,862 A | 2/2000 | Newton et al. | |
| 6,023,243 A | 2/2000 | Frank | |
| 6,111,549 A | 8/2000 | Feller | |
| 6,181,282 B1 | 1/2001 | Gans et al. | |
| 6,224,951 B1 | 5/2001 | Centanni et al. | |
| 6,292,370 B1 | 9/2001 | Anderson et al. | |
| 6,320,547 B1 | 11/2001 | Fathy et al. | |
| 6,326,920 B1 | 12/2001 | Barnett et al. | |
| 6,351,247 B1 | 2/2002 | Linstrom et al. | |
| 6,356,166 B1 | 3/2002 | Goldsmith et al. | |
| 6,362,780 B1 | 3/2002 | Butz et al. | |
| 6,417,806 B1 | 7/2002 | Gothard et al. | |
| 6,424,313 B1 | 7/2002 | Navarro et al. | |
| 6,469,255 B2 | 10/2002 | Watanabe et al. | |
| 6,477,052 B1 | 11/2002 | Barcley | |
| 6,483,713 B2 | 11/2002 | Samant et al. | |
| 6,611,230 B2 | 8/2003 | Phelan | |
| 6,778,139 B2 | 8/2004 | Suzuki et al. | |
| 6,841,739 B2 | 1/2005 | Moore | |
| 6,914,324 B2 | 7/2005 | Rapport et al. | |
| 6,914,566 B2 | 7/2005 | Beard | |
| 6,937,192 B2 | 8/2005 | Mendolia et al. | |
| 6,947,088 B2 | 9/2005 | Tillery et al. | |

(Continued)

*Primary Examiner*—Michael C Wimer
(74) *Attorney, Agent, or Firm*—Sheridan Ross P.C.

(57) ABSTRACT

A modular electronic architecture according to which electrical components are distributed across substantially identical, interconnected circuit elements or assemblies is provided. Scaling of the electronic device can be achieved by selecting different numbers of circuit elements. Embodiments of the present invention may also provide for a compact assembly, formed from interconnection of separate circuit boards in a stack. Particular applications include the provision of beam forming networks in connection with phased array antennas in which the beam forming networks are formed on circuit boards having an area that is about the same size as the area of a circuit board on which the antenna elements are formed.

18 Claims, 9 Drawing Sheets

U.S. PATENT DOCUMENTS

| | | |
|---|---|---|
| 2002/0014996 A1 | 2/2002 | Keilen |
| 2004/0020687 A1 | 2/2004 | Moore |
| 2004/0150561 A1 | 8/2004 | Tillery et al. |
| 2005/0170291 A1 | 8/2005 | Berg |
| 2005/0190104 A1 | 9/2005 | Coleman et al. |
| 2005/0221633 A1 | 10/2005 | Wildes et al. |

\* cited by examiner

MODULAR ELECTRONIC ARCHITECTURE

FIELD OF THE INVENTION

The present invention is directed to a modular electronic architecture. In particular, the present invention permits the distribution of multiple electronic components across a number of modular circuit assemblies.

BACKGROUND OF THE INVENTION

Electronic circuits typically include a number of components. These components can be discrete devices, or provided as part of integrated circuits. Whether provided as discrete devices or integrated circuits, multiple electronic components are often interconnected to one another by placing those components on a common printed circuit board. In addition to providing a structural member to which components can be attached, a printed circuit board typically provides traces on one or more layers to conduct power and signals to and between attached components. When used in connection with implementing complex circuits, the design of the individual circuit boards can also become quite complex. In addition, where a large number of components are to be interconnected to a printed circuit board, the area of the board can become quite large, and a relatively large number of layers may be required to provide the necessary connective traces. In addition to providing conductive traces, certain electronic components can be integrated directly into a printed circuit board.

One consideration in the design of electronic circuits is the size of those circuits. In particular, by making devices smaller, certain performance parameters can be improved, and the device can be easier to package and transport. Also, it can be desirable to maintain electronic circuitry within size limits that are defined by certain components of a device implemented using the electronic circuitry or a component of that circuitry.

One example of electronic circuitry that can be quite complex, but that is desirably deployed within a relatively small area, is a phased array antenna. In a phased array antenna, multiple antenna elements or radiators are deployed across a surface. The size of each antenna element is generally determined by the intended operating frequency or frequencies of the antenna. Furthermore, as more antenna elements are provided, the antenna beam can be more narrowly focused and directed by applying selected phase delays to the signal comprising the beam that is delivered to (or received from) each of the antenna elements. That is, by varying the delay of a signal, the corresponding beam can be scanned along one dimension for a one dimensional array of antenna elements and along two dimensions for a two dimensional array of elements. In addition, the maximum scanning angle that can be provided by an antenna will increase as the space between antenna elements is decreased. Accordingly, the radiator or antenna elements of a phased array antenna generally occupy an area that is defined by the size of the individual antenna elements, the number of antenna elements, and the spacing between antenna elements.

Within the area defined by the antenna elements of a phased array antenna, on a side of a circuit board opposite the side on which the antenna elements are formed, circuits have been developed that allow the phase delay of two separate beams to be controlled. However, where a phased array antenna is intended for simultaneous communications with or tracking of a larger number of targets, it is desirable to increase the number of beams that can be individually controlled. This has been difficult or impossible to achieve using conventional techniques in connection with the circuit board on which the antenna elements are formed. In addition, because higher frequencies generally require a smaller antenna element, it has been especially difficult to provide supporting circuitry for systems designed to operate at high frequencies.

In order to provide the area necessary for complex beam forming networks, additional circuit boards containing components of the beam forming network can be placed behind the board on which the antenna elements are formed, for example on circuit boards arranged perpendicular to the antenna element boards. That is, the space available for circuitry can be expanded into three dimensions. Although such systems provide a place for the circuitry required to provide a number of steered beams, they do not address issues of design difficulty and ease of expansion. In particular, each board or other unit of circuitry typically includes elements that are unique to that board.

SUMMARY OF THE INVENTION

The present invention is directed to solving these and other problems and disadvantages of the prior art. In accordance with embodiments of the present invention, a modular electronic architecture is provided. The modular electronic architecture allows circuits that perform like or identical functions to be implemented using like or identical circuit elements or boards that are interconnected to one another in a modular fashion. In particular, the number of functions supported by a grouping of such circuit elements can be expanded simply by adding additional circuit elements or boards to the assembly. Furthermore, the architecture permits circuitry to be contained within an area defined by other components of the device. Accordingly, size, complexity and design costs can all be addressed by embodiments of the present invention.

In accordance with embodiments of the present invention, a number of identical or substantially identical circuit elements or assemblies are interconnected to one another. In accordance with further embodiments of the present invention, a first signal passing through a first circuit element may be modified or processed by the first circuit element provided as part of a modification channel and then passed to a second circuit element while a second signal may be passed by the first circuit element to the second circuit element substantially unaltered by a pass through channel. The second circuit element may then pass the first signal to yet another circuit element (or a circuit assembly of some other type) substantially unaltered by the second circuit element, and may modify or process the second signal before sending the second signal to a third circuit element like the first and second circuit elements, or to some other circuit assembly. In accordance with still other embodiments of the present invention, a signal that is not otherwise modified or processed by a circuit element may be amplified by that circuit element before being passed to another circuit assembly.

In accordance with still other embodiments of the present invention, a modular electronic architecture as described herein is applied in connection with a phased array antenna. In connection with such embodiments, a number of identical or substantially identical circuit elements or assemblies may be provided that each form one or more beams or channels of an overall phased array antenna structure. According to such embodiments, each modular beam forming circuit element may apply a selected phase delay to a copy of a signal and deliver the phase delayed copy of the signal to a next beam forming circuit element, to an antenna element assembly, to transceiver circuitry, or to some other circuitry. In addition, each beam forming circuit element passes at least one signal without attempting to steer that signal by applying a selectable phase delay. According to such embodiments, additional beams of an antenna assembly can be supported by adding additional beam forming circuit elements, at least until the number of provided pass through circuits for signals not phase delayed by a particular circuit element are exceeded.

In accordance with still other embodiments of the present invention, circuit elements or assemblies may be provided as planar or substantially planar circuit boards. In general, circuit elements implemented as part of a substantially planar circuit board include first and second sides that provide or define an area within which various electronic devices or components can be formed or attached. In addition, such circuit boards can have multiple layers. Identical or substantially identical circuit assemblies implemented using identical or substantially identical circuit boards may be interconnected to one another by interconnecting one or more connectors on a second side of a first one of the circuit assemblies to one or more mating connectors on a first side of a second one of the circuit assemblies. Furthermore, interconnecting may include aligning the first and second circuit assemblies so that one is turned or rotated by about 180° with respect to the other.

In addition to multiple similar or substantially similar circuit elements or assemblies, embodiments of the present invention allow for the interconnection of unique circuit assemblies. For example, a circuit assembly comprising an antenna radiator element assembly having a number of connectors can be interconnected to a first one of a number of beam forming circuit elements. Furthermore, each signal received (or transmitted) by radiator elements on the radiator circuit board is passed to the first beam forming circuit board. In addition, a transceiver circuit board may be interconnected to a last beam forming circuit element, for example to demodulate signals corresponding to beams or channels supported by the antenna assembly. Where the various circuit elements or assemblies are implemented as circuit boards, a phased array antenna assembly can be formed from a stack of such boards that includes an antenna element board at a first end of the stack, a number of beam forming boards intermediate to the stack, and a transceiver board at an end of the stack opposite the antenna element board. In accordance with still other embodiments of the present invention, the size of the antenna element board, the beam forming boards, and any additional boards, is substantially defined by the size, number and spacing of the antenna elements.

Additional features and advantages of the present invention will become more readily apparent from the following detailed description, particularly when taken together with the accompanying drawings.

DETAILED DESCRIPTION

The present invention is directed to a modular electronic architecture. In connection with embodiments of the present invention, the described modular architecture permits circuit elements to be replicated as identical or substantially similar circuit assemblies interconnected to one another. The capabilities of the resulting electronic assembly can be tailored to the needs of a particular application by selecting an appropriate number of the identical or substantially similar circuit elements or assemblies. Furthermore, embodiments of the present invention provide an architecture according to which all of the signals that may be modified or processed by the complete or aggregated circuit assemblies are passed through each of the identical or substantially similar circuit elements, even though a particular circuit element may operate or transform only a subset of those signals. One application for such a modular architecture is the creation of phased array antenna assemblies.

Figure 1:
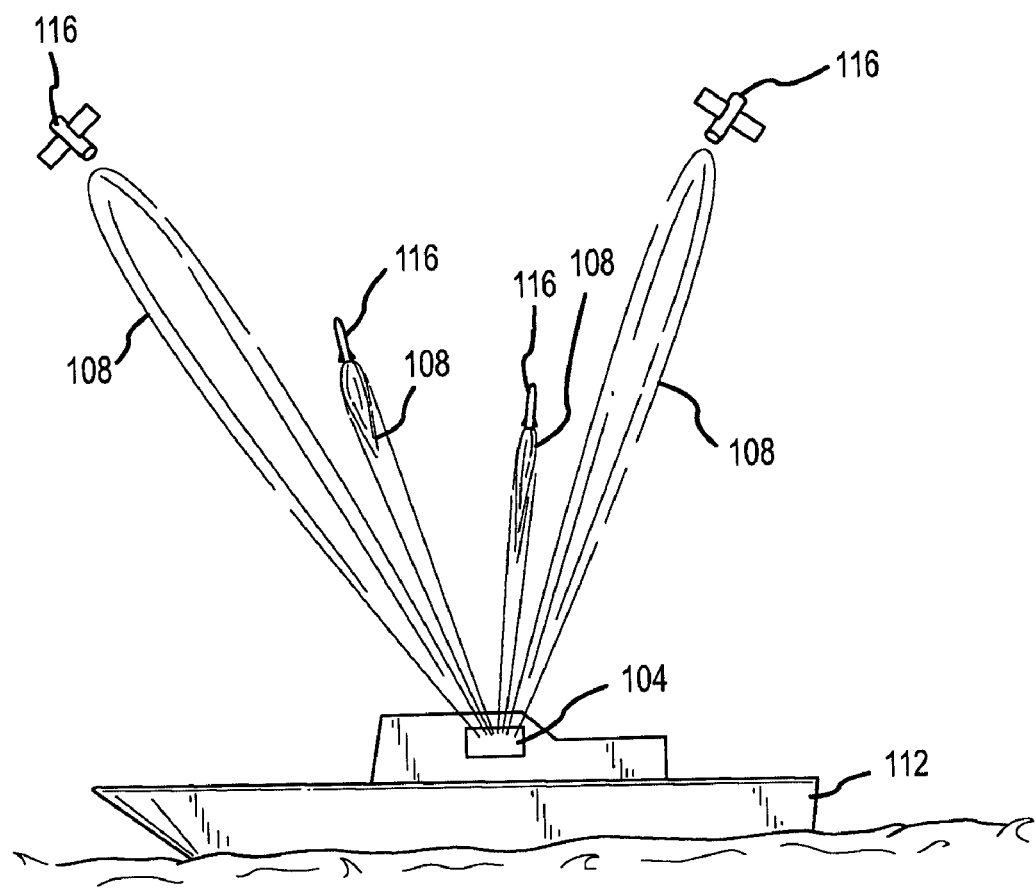
FIG. 1 depicts a multiple beam phased array antenna in an exemplary operating environment.

With reference now to FIG. 1, a phased array antenna assembly 104 capable of forming a number of independent beams 108 is depicted in an exemplary operating environment. In the example of FIG. 1, the beams 108 formed by the phased array antenna assembly 104 are used in connection with communications between the platform 112 with which the phased array antenna assembly 104 is associated and various targets 116. Although depicted as being deployed on a platform comprising a ship 112, it can be appreciated that a phased array antenna 104 capable of forming multiple antenna beams 108 can be deployed in connection with any device or location where multiple signal paths or channels are desired. Furthermore, while the example targets 116 depicted in the figure are shown as space borne satellites or airborne missiles, a target 116 can comprise any ground, sea, air, or space based device or platform. Also, while the example system shown in FIG. 1 is described as being used for communications, such as for sending or receiving data, telemetry or control instructions, it can be appreciated that another exemplary use for a phased array antenna 104 may include radar systems for identifying and tracking targets. Furthermore, although four antenna beams 108 are depicted, a phased array antenna assembly 104 in accordance with embodiments of the present invention, is not limited to any particular number of beams.

Figure 2:
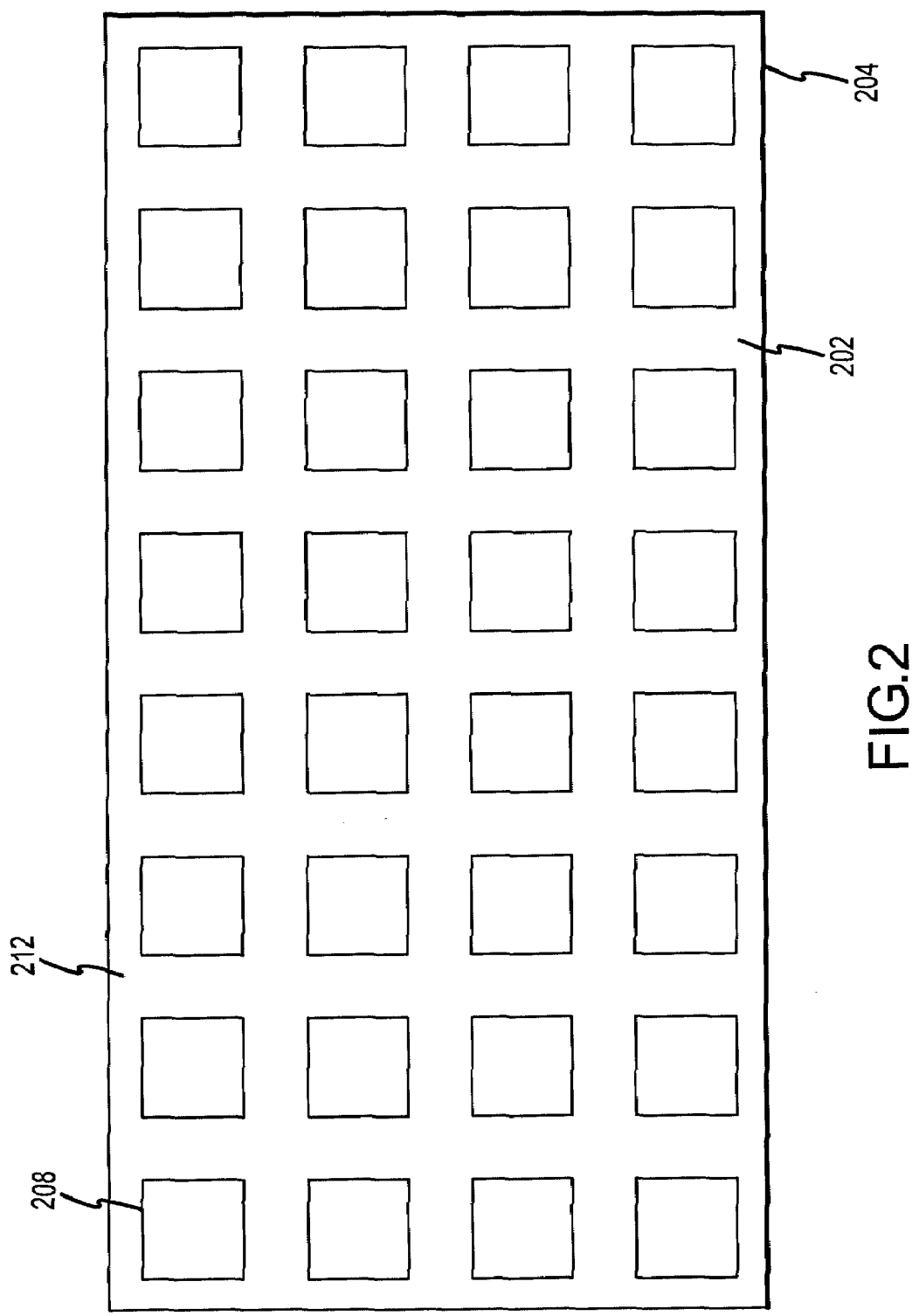
FIG. 2 depicts a first side of an antenna radiator element circuit board in accordance with embodiments of the present invention.

With reference now to FIG. 2, a first side 202 of an antenna radiator circuit board or assembly 204, such as may be used in connection with a phased array antenna assembly 104 in accordance with embodiments of the present invention, is depicted. In general, the antenna radiator assembly 204 may comprise a number of radiator elements 208 deployed along the surface of a board 212. The radiator elements 208 may be formed by etching a metallic layer provided as part of a board 212 comprising a printed circuit board, by depositing or adhering metallic antenna elements 208 to a board or substrate 212, or by any other process suitable for forming a number of antenna elements 208 as part of an antenna radiator assembly 204 of a phased array antenna 104. Accordingly, the radiator element assembly may comprise a printed circuit board or other type of substantially planar circuit assembly. As used herein, a substantially planar circuit assembly comprises a substrate that is flat (within normal manufacturing tolerances), and can have various components and connectors that extend from the surface of the substrate. Furthermore, although an antenna radiator assembly 204 is typically provided in connection with a planar or substantially planar board 212, embodiments of the present invention are not so limited. For example, the board 212 may be contoured, for example to follow the surface of a platform 112 to which the phased array antenna assembly 104 is attached to or integrated with. In addition, it can be appreciated that certain discrete components can be mounted or interconnected to the surface of the board 212.

In general, the radiator elements 208 are sized as required to support the operating frequency or frequencies of the phased array antenna assembly 104. Accordingly, the radiator elements 208 will tend to be smaller for use in connection with phased array antenna assemblies 104 operating at relatively high frequencies, as compared to radiator elements 104 for use in connection with phased array antenna assemblies 104 operating at relatively low frequencies. As can also be appreciated by one of skill in the art, the number of radiator elements 208 provided as part of a phased array antenna assembly 104 determines the width of the beams 108 that can be produced by the assembly 104. More particular, by providing a larger number of radiator elements 208, narrower beams 108 can be formed or composed. Another consideration with respect to the provision of an antenna radiator assembly 204 is the spacing between radiator elements 208. In general, as radiator elements 208 are placed closer to one another, the angle over which a beam produced by the antenna assembly 104 can be scanned is increased.

Figure 3:
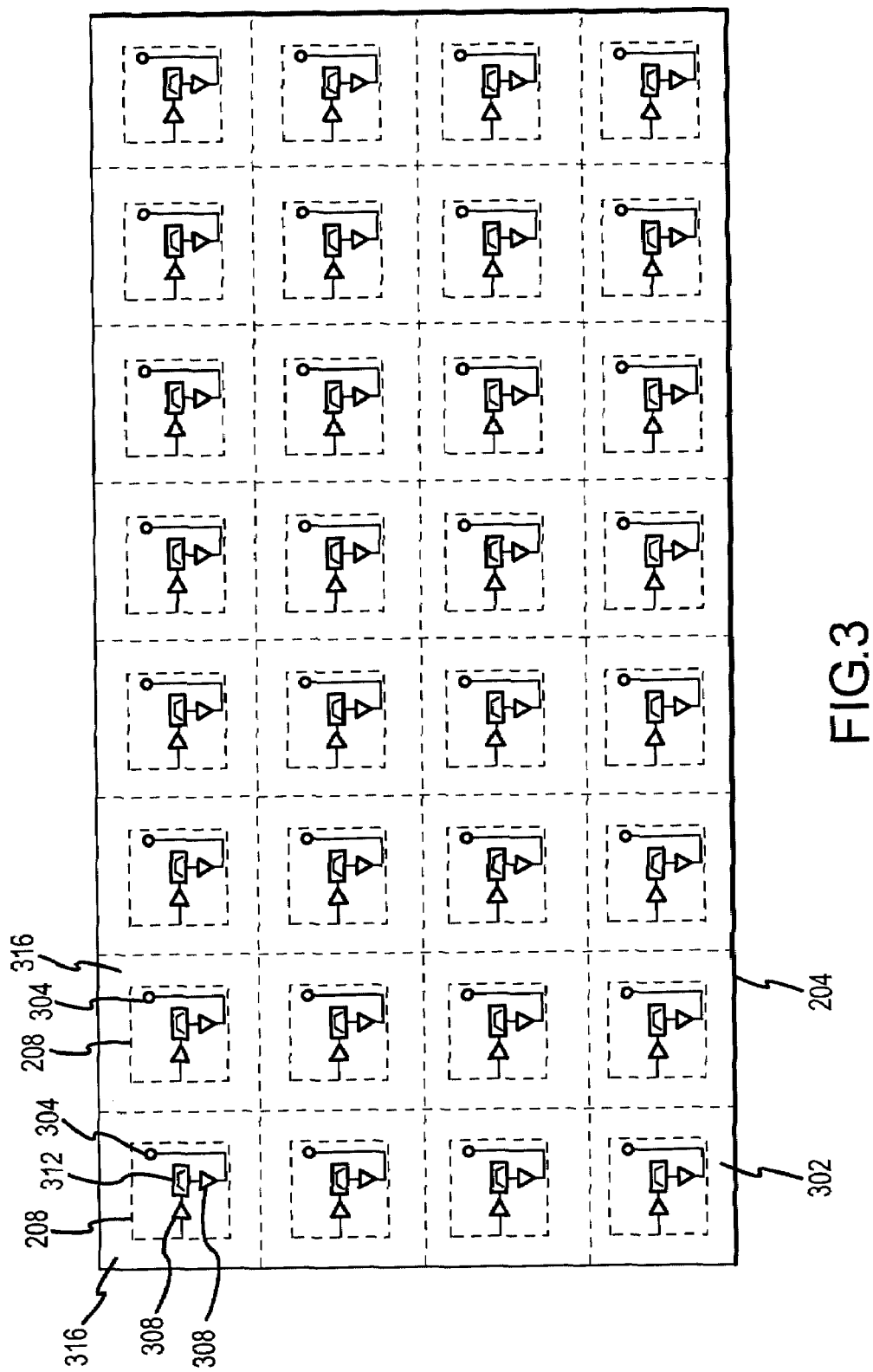
FIG. 3 depicts a second side of an antenna radiator element circuit board in accordance with embodiments of the present invention.

With reference now to FIG. 3, a second side 302 of an antenna radiator element board, opposite the first side 202 illustrated in FIG. 2, is depicted. The outline of the radiator elements are shown as dotted lines for reference. In general, at least one connector 304 is associated with each radiator element 208. The connector 304 is adapted to interconnect with a corresponding connector on the next circuit board, as described elsewhere herein. In addition to providing a connector 304, various components may be formed on and/or interconnected to the second side 302 of the antenna radiator board 204. For example, various low noise amplifiers 308, filters 312 or other components may be provided in connection with each of the radiator elements 208. Furthermore, although the exemplary components 308, 312 are shown within the area corresponding to the area of the associated radiator element 208, it can be appreciated that the area available to such componentry is generally defined by the area of the radiator element 208 plus at least one-half of the area between the radiator element 208 and neighbor radiator elements 208 (shown as area 316 in FIG. 3).

Figure 4:
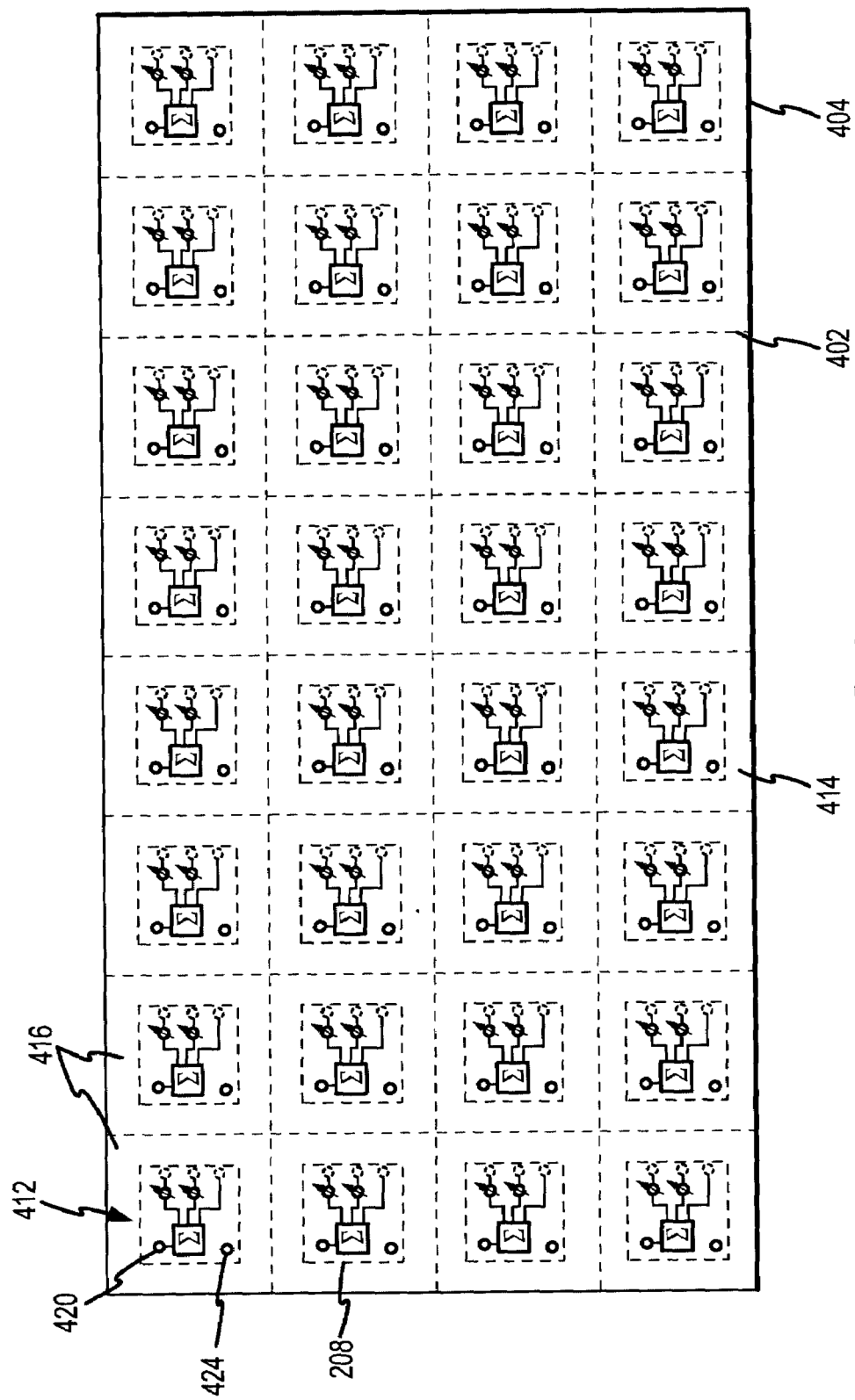
FIG. 4 depicts a first side of a beam forming circuit board in accordance with embodiments of the present invention.

With reference now to FIG. 4, an intermediate circuit board 404 is depicted. More particularly, in the present example, a first side 402 of a phase shifter or beam forming network circuit board assembly or element 404 is illustrated. In general, the phase shifter circuit board 404 provides a set of beam forming components 412, interconnected to a substrate or board 414, for each radiator element 208 supported by the phase shifter circuit board 404. The board 414 may comprise a printed circuit board or other structure suitable for use in providing or forming circuits. Accordingly, a phase shifter element 404 may comprise a substantially planar circuit assembly. For purposes of illustration, the outlines of the radiator elements 208 supported by the example phase shifter circuit board 404 are shown. More particularly, the locations of the radiator elements 208 with respect to the phase shifter circuit board 404 when the boards 204, 404 are interconnected to one another and are viewed along a direction generally perpendicular to the planes or surfaces defined by the first sides 202, 402 of the boards 204, 404 are shown. In general, the space available for beam forming or shifting components 412 and other components and signal lines may be defined by the area of the associated radiator element 208 and about or at least one-half the area between that radiator element 208 and neighbor radiator elements 208, shown as area 416. In addition to providing beam shifting components 412, connectors 420 are provided. In general, the connectors 420 are located and adapted for mating with the connectors 304 provided on the second side 302 of the antenna radiator element board 204.

The first side 402 of the phase shifter circuit board 404 may also include additional connectors 424. These additional connectors 424 do not necessarily need to interconnect to a connector provided by the radiator element circuit board 204. However, as will be described in greater detail elsewhere herein, additional connectors 424 may be used when the first side 402 of a phase shifter circuit board 404 is interconnected to another phase shifter circuit board 404.

Figure 5:
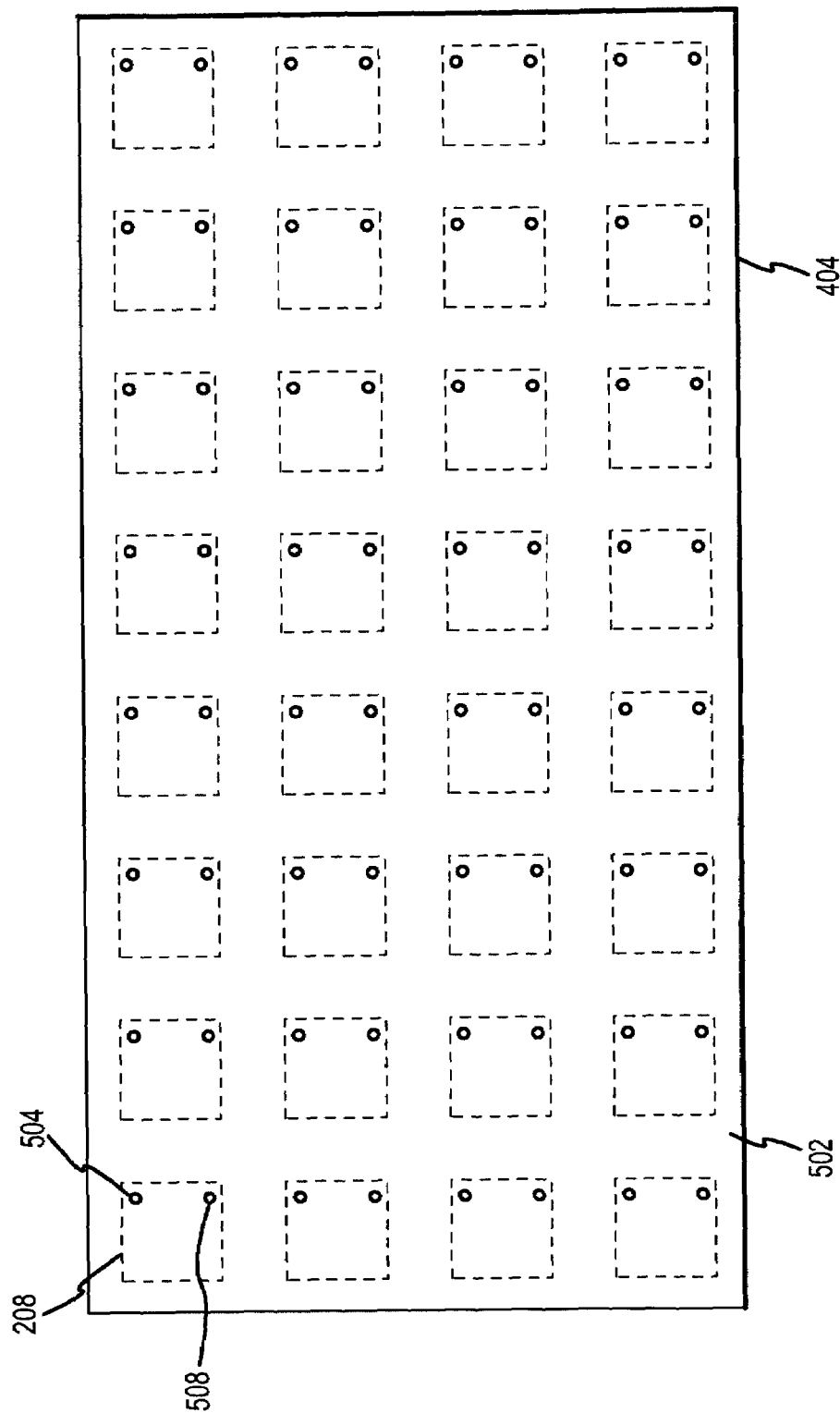
FIG. 5 depicts a second side of a beam forming circuit board in accordance with embodiments of the present invention.

With reference now to FIG. 5, a second side 502 of a phase shifter circuit board assembly or element 404 in accordance with embodiments of the present invention is illustrated. In general, the second side 502 of the phase shifter circuit board 404 includes at least one connector 504 for each supported antenna radiator element 208 (shown as a dotted line in FIG. 5 for reference). In addition, connectors 508 are provided for interconnecting to an additional connector, such as the connector 424 provided on a first side 402 of another phase shifter circuit board 404. Accordingly, with respect to multiple interconnected phase shifter circuit boards 404, or to other circuit boards having mating connectors, all of the provided connectors may be aligned with corresponding connectors.

Figure 6:
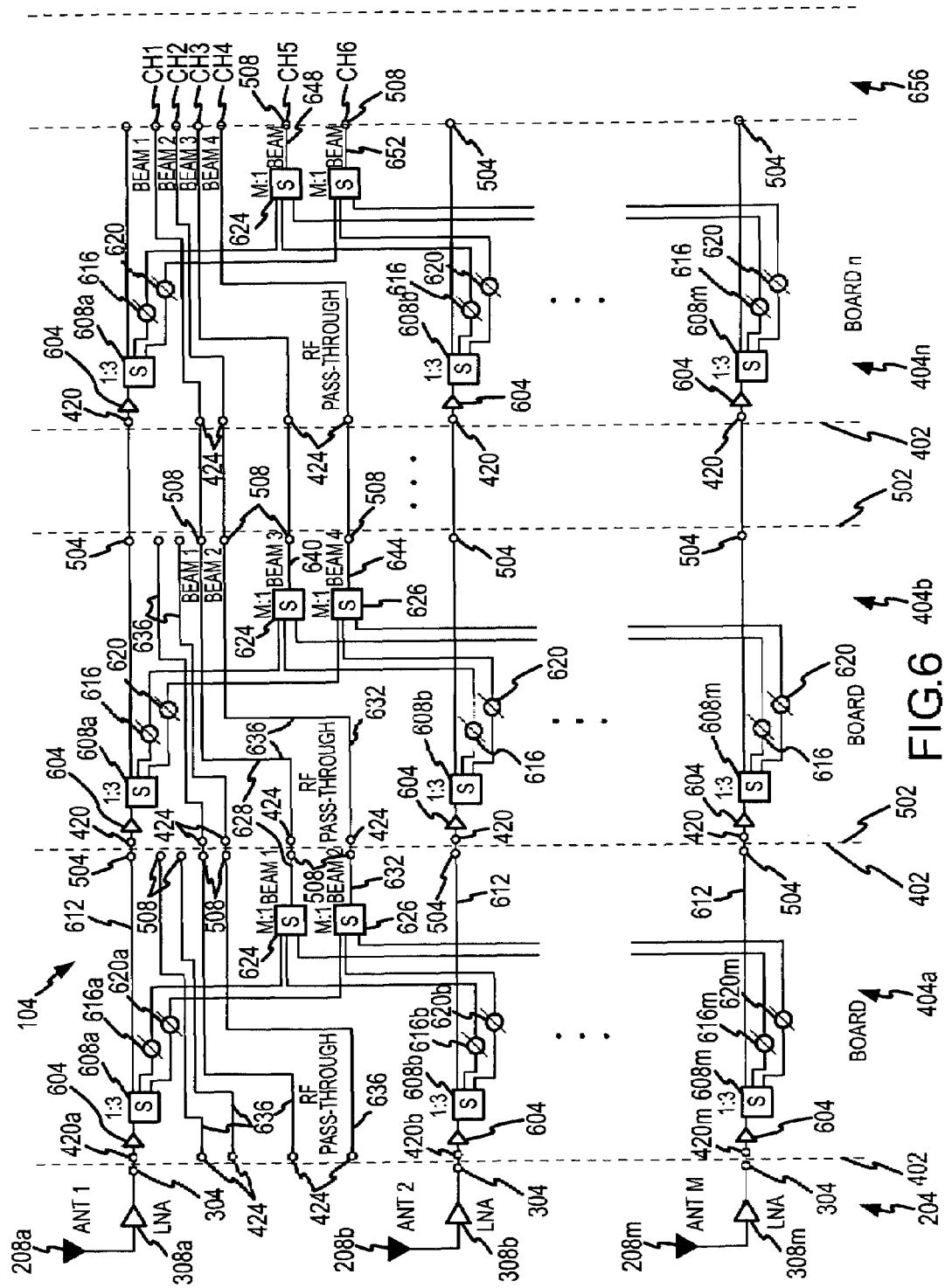
FIG. 6 is a schematic depiction of components of various interconnected modular circuit elements in accordance with embodiments of the present invention.

With reference now to FIG. 6, various components that may be included as part of a phased array antenna system 104 in accordance with embodiments of the present invention are illustrated. In particular, an antenna radiator assembly 204 interconnected to a first phase shifter circuit board assembly or element 404a, to a second phase shifter circuit board assembly or element 404b (through the first phase shifter circuit board element 404a), and to a third phase shifter circuit board assembly or element 404c (through the first 404a and second 404b phase shifter circuit board elements) are depicted schematically.

With respect to the antenna radiator assembly 204, three separate radiator elements 208a-m are depicted. As also shown in FIG. 6, each radiator element 208 is associated with a low noise amplifier 308. Although only three radiator elements 208 are shown, as a general proposition, any number (m) of radiator elements 208 may be provided. In addition, as noted elsewhere, the provision of additional components, such as low noise amplifiers 308, filters or other devices is optional. Each radiator element 208a-m (and any other components, such as a low noise amplifier 308a-m) is associated with a connector 304.

The connectors 304, which are generally provided on a second side 302 of the antenna radiator assembly 204, form a completed connection with corresponding connectors 420a-m provided on the first side 402 of the first phase shifter circuit board 404a. Second connectors 424 on the first side 402 of the phase shifter circuit board 404 may also be provided in connection with embodiments of the present invention. However, such connectors 424 may be unused. For example, second connectors 424 on the first phase shifter circuit board 404a need not mate with any corresponding connector on the antenna radiator assembly 204.

The connector pairs formed by the connectors 304 provided by the antenna radiator assembly 204 and the connectors 420 of the first phase shifter circuit board 404a generally pass signals between the radiator elements 208 and the phase shifter circuit board 404. In general, the discussion herein will proceed to describe signals received by the radiator elements 208. However, as can be appreciated by one of skill in the art, the phased array antenna system 104 may also be applied, and typically is applied, to the transmission of signals, as well as their reception. Signals passed across the connector pairs 304, 420 may be passed through a low noise amplifier 604. After amplification in the low noise amplifier 604, each of the signals from the radiator elements 208a-m may be passed to a splitter 608a-m. As can be appreciated by one of skill in the art, the splitters 608 are equivalent to and function as combiners with respect to signals being transmitted by the antenna assembly 104. In general, each splitter 608 divides the signal from the radiator element 208 with which it is associated into a number of branches equal to the number of beams (k) formed by the phase shifter board 404 on which the splitter 608 is located, plus one. For example, as illustrated in FIG. 6, where the first phase shifter board 404a is capable of forming two beams (i.e., k=2), the splitters 608 divide the signal from each radiator element 208 into three (i.e., k+1) separate paths. That is, the energy comprising the signal from each radiator element 208, which may have been amplified by one or more amplifiers 308, 604, is divided among three paths. A first of the paths comprises a pass through channel or signal line 612 that is terminated in a connector 504. That is, the first signal path from the splitters 608 is passed across the first phase shifter board 404a without processing or modification. More particularly, in the context of the present example of a phase shifting antenna, the signal provided at the output 504 is not subjected to one of a plurality of possible phase shifts within the first phase shifter board 404a.

Continuing the example of FIG. 6, m first phase shifters 616a-m and m second phase shifters 620a-m are provided. The second and third outputs from each splitter 608a-m are passed through corresponding first 616 and second 620 phase shifters, respectively. By applying a coordinated phase shift at each of the first phase shifters 616 of the first phase shifter board 404a, a first beam may be pointed in a desired direction. Similarly, by coordinating a phase shift applied by the second phase shifters 620 of the first phase shifter circuit board 404a, a second beam can be pointed as desired. As can be appreciated by one of skill in the art in view of the description provided herein, each of the phase shifters 616, 620 may be provided with a control signal to select a desired phase shift amount. Furthermore, the phase shifters 616, 620 may be capable of introducing phase shift amounts or delays selected from within an available range of phase shifts or delays, or the phase shift or delay can be selected from a number of preset values. As can also be appreciated by one of skill in the art in view of the description provided herein, the phase shift provided with respect to a beam is generally varied or tapered across the radiator elements 208. Accordingly, the amount of phase shift imparted by a phase shifter 616 or 620 associated with a first radiator element 208 may differ from the phase shift imparted by a phase shifter 616, 620 for the same beam on a second radiator element 208. This difference in relative phase shift may be introduced by the different phase shifters 616 or 620 themselves, or by associated circuitry.

The output from each of the first phase shifters 616a-m is combined by an m:1 combiner 624, where m is equal to the number of antenna radiator elements 208, to form a first beam or channel that is carried by a first beam signal line 628. Similarly, the output from each of the second phase shifters 620a-m is combined by a second m:1 signal combiner 626 to form a second beam or channel that is carried by a second beam signal line 632. The first 628 and second 632 beam signal lines are passed to connectors 508. As can be appreciated by one of skill in the art, the combiners 624,626 are equivalent to and function as splitters with respect to signals being transmitted by the antenna assembly 104. The phase shifters 616,620, combiners 624,626 and beam signal lines 628,632 are examples of components comprising or included in modification channels provided as part of the phase shifter board 404.

The first phase shifter board 404a may additionally include a number of modified signal pass through signal lines 636 terminated at a first end on the first side 402 of the phase shifter board 404a at connectors 424, and terminated at a second end on a second side 502 of the first phase shifter board 404a at connectors 508. These modified signal pass through signal lines 636, in the embodiment illustrated in FIG. 6, serve no purpose in connection with the first phase shifter board 404a. Therefore, they may be omitted. However, as will become apparent from the continuing discussion, provision of the modified signal pass through signal lines 636 and associated connectors 424, 508 allows a number of identical or substantially identical phase shifter boards or elements 404 to be interconnected to support a selected number of beams in connection with a phased array antenna system 104. That is, in accordance with embodiments of the present invention, by incorporating a number of identical or substantially identical phase shifter boards 404, antennas having different numbers of beams may be constructed easily, without requiring custom beam forming or phase shifting circuit assemblies or boards. As used herein, one circuit board, such as a phase shifter element 404, is substantially identical to another circuit board if the boards are functionally equivalent and provide a like set of connectors.

The connectors 504, 508 on the second side 502 of the first phase shifter circuit board 404a are interconnected to or joined with corresponding connectors 420, 424 on a first side 402 of the second phase shifter circuit board 404b. As noted above, the second phase shifter board 404b may be identical to the first phase shifter board 404a. Accordingly the second phase shifter board 404b may include low noise amplifiers 604 and splitters 608a-m. The inputs to the splitters 608a-m of the second phase shifter circuit board 404b comprise signals from the signal paths 612 that were not processed or modified by the first phase shifter circuit board 404a. Continuing the present example, the second phase shifter board 404b, like the first phase shifter circuit board 404a, generally includes first 616 and second 620 phase shifters for selectively introducing phase shifts to a portion of the signal passed to each splitter 608, thereby forming two additional beams. The signals from each of the first phase shifters 616 are brought together in a first combiner 624 to form the third beam or channel that is carried by a third beam signal line 640. The signals from the second phase shifters 620 are brought to a second combiner 626 to form the fourth beam or channel that is carried by a fourth beam signal line 644. The third 640 and fourth 644 beam signal lines are each terminated in a connector 508.

The first and second beams formed by the first phase shifter circuit board 404a are passed across the second phase shifter board 404b by two of the modified signal pass through signal lines 636. No variable or selected phase shift or other signal modification is introduced to the first or second beams by the second phase shifter circuit board 404b. However, amplification and/or filtering may be performed with respect to the first and second beams if desired. Two of the modified signal pass through signal lines 636 on the second phase shifter circuit board 404b are unused in the exemplary embodiment illustrated in FIG. 6.

Each of the connectors 504, 508 on a second side 502 of the second phase shifter circuit board 404b that is connected to operative signal lines is interconnected to a connector 420 or 424 on a first side 402 of a third phase shifter circuit board 404n. As shown in the example of FIG. 6, the third phase shifter circuit board 404n is identical to the first 404a and second 404b phase shifter circuit boards. Accordingly, the third phase shifter board 404n may include a number of low noise amplifiers 604. In addition, the third phase shifter board 404n according to the present example includes m splitters 608a-m. Continuing the present example, according to which each of the phase shifter boards 404a-m forms two beams, the third phase shifter board 404n also generally includes m first 616a-m and m second 620a-m phase shifters for selectively introducing phase shifts to a portion of the signal passed to each splitter 608, thereby forming two additional beams. The signals from each of the first phase shifters 616a-m are brought together in a first combiner 624 to form the fifth beam or channel, which is carried by a fifth beam signal line 648. The signals from the second phase shifters 620a-m are brought to a second combiner 626 to form the sixth beam or channel, which is carried by a sixth beam signal line 652. The fifth 648 and sixth 652 signal lines are each terminated in a connector 508.

The first, second, third and fourth beams are passed across the third phase shifter board 404n by four of the modified signal pass through signal lines 636. No variable or selected phase shift or other signal modification is introduced to the first through fourth beams by the third phase shifter circuit board 404n. However, amplification and/or filtering may be performed with respect to the first through fourth 628 through 644 beams if desired.

If the third phase shifter circuit board 404n is the last phase shifter circuit board 404 included in the phased array antenna 104, each of the connectors 504, 508 on a second side 502 of the third phase shifter circuit board 404n may be interconnected to a channel of a transceiver 656, either provided as part of an additional circuit board, or provided as separate circuitry. Furthermore, if the third phase shifter circuit board 404n is the last phase shifter circuit board 404, the six outputs 508 corresponding to the beams or channels of the example phased array antenna assembly 104 may be interconnected to corresponding circuits in a transceiver 656, while the connector 504, corresponding to a signal line on which any transmitted signals have not been phase shifted, need not be connected to a channel of a transceiver 656. For example, the connectors 504 may simply be left unconnected to any additional circuitry, or may be terminated in circuitry for attenuating or preventing losses in other signal lines associated with the phased array antenna 104. Furthermore, it can be appreciated that where each phase shifter circuit board 404 is capable of forming k beams, the number of beams provided by the completed antenna assembly 104 is n×k, where n is the number of phase shifter circuit boards. More generally, it should be appreciated that a circuit assembly using a modular architecture as described herein can perform at least n×k functions, where n is the number of intermediate circuit boards 404 and k is the number of functions provided per board.

Figure 7:
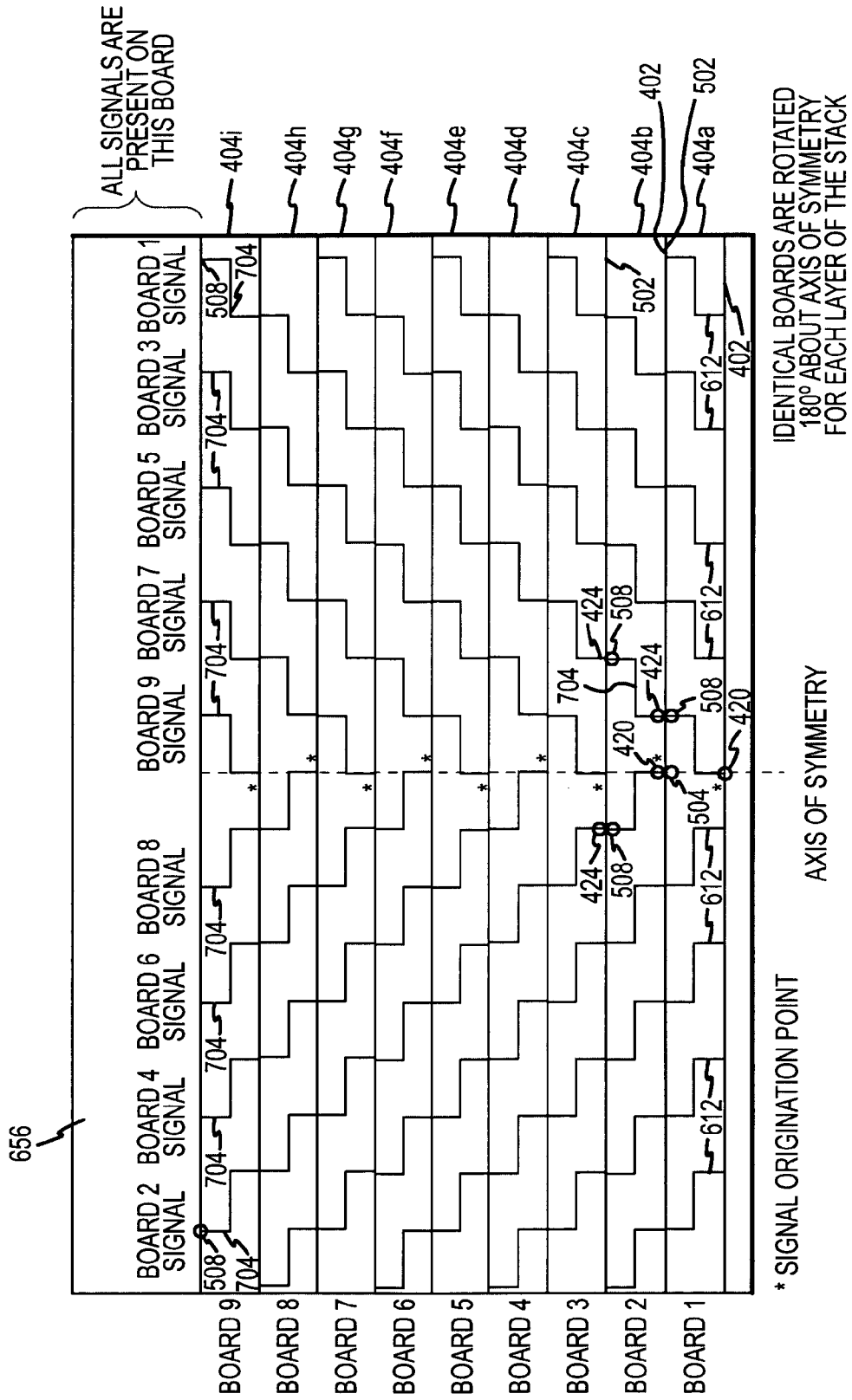
FIG. 7 is a schematic depiction of a cross-section of multiple interconnected modular circuit elements in accordance with embodiments of the present invention.

With reference now to FIG. 7, a cross-section of multiple interconnected modular circuit assemblies is schematically depicted. In particular, an antenna radiator circuit board 204, nine phase shifter circuit boards 404a-i, and a transceiver 656 are depicted in cross-section. Each of the phase shifter circuit boards 404 forms one or more beams or channels of a phased array antenna 104. Accordingly, if the first board 404a is interconnected to an antenna radiator circuit board 204, and the ninth phase shifter circuit board 404i is interconnected to a transceiver 656, each of the boards 404 performs a phase shift with respect to a portion of the received or transmitted signal to form an additional beam or beams. Therefore, all of the beams or channels supported by the assembly are present at the outputs from the ninth board 404i in the present example.

The first phase shifter circuit board 404a receives a signal from an antenna radiator element provided as part of the antenna radiator circuit board 204 at a connector 420 on the first side 402 of the phase shifter circuit board 404a. The received signal is split into a number of signal lines, and the signal on at least one of those lines is processed or modified to form a first beam or signal. The first beam is passed to a connector 508 on the second side 502 of the first phase shifter circuit board 404a. The first phase shifter circuit board 404a also passes a portion of the signal received from the antenna element 208 to a connector 504 on the second side 502 of the first circuit board assembly 404a.

The second phase shifter circuit board 404b is generally identical to the first phase shifter circuit board 404a. Furthermore, the second phase shifter circuit board 404b is positioned such that the substantially planar first side 402 of the second phase shifter circuit board 404b faces and is generally parallel to the substantially planar second side 502 of the first phase shifter circuit board 404a. In addition, the second phase shifter circuit board 404b is rotated 180° with respect to the first phase shifter circuit board 404a.

A connector 424 on the first side 402 of the second phase shifter circuit board 404b interconnects to the connector 508 on the second side 502 of the first phase shifter circuit board 404a. The first beam formed by the first phase shifter circuit board 404a is thus passed to the second phase shifter circuit board 404b across that connector pair 424, 508. The first beam is then passed by the second phase shifter circuit board 404b without processing or modifications to a connection 508 on the second side 502 of the second phase shifter circuit board 404b. That connector 408 is interconnected to a mating connector 424 on the third phase shifter circuit board 404c.

A connector 420 on the first side 402 of the second phase shifter circuit board 404b interconnects to the connector 504 on the second side 502 of the first phase shifter circuit board 404a, and the portion of the signal received from the antenna element that is not processed or modified in the first phase shifter circuit board 404a is provided to the second phase shifter circuit board 404b across that connector pair 420, 504. That signal may then be divided into a number of signals, and at least one of those signals may be processed or modified by the second phase shifter circuit board 404b. The signal processed or modified by the second phase shifter circuit board 404b is passed to an output 508 on the second side 502 of the second phase shifter circuit board 404b, where it can be interconnected to a connector 424 on the first side 402 of the third phase shifter circuit board 404c.

The process described with respect to the first 404a and second 404b phase shifter circuit boards may continue through the entire stack of nine printed circuit boards 404a-i. In general, once a signal has been processed or modified by a previous phase shifter circuit board 404, succeeding phase shifter circuit boards 404 pass that signal on without additional processing or modification. Accordingly, the number of signal lines 704 carrying a processed or modified signal increases from the first phase shifter circuit board 404a to the last phase shifter circuit board 404i. Therefore, separate signal lines 704 for each of the signals are present on the last phase shifter circuit board 404i.

As shown in FIG. 7, a number of signal lines 612 provided by the assembly of phase shifter circuit boards 404a-i do not carry any signal. However, this aspect of embodiments of the present invention supports the modular nature of the circuit assembly architecture. In particular, identical phase shifter circuit boards 404 can be used at each phase shifter circuit board 404 position in a completed phased array antenna assembly 104, to simplify manufacturing of phase shifter circuit boards 404 and of phased array antennas 104 incorporating such circuit boards 404.

In addition, FIG. 7 illustrates how an assembly comprising a stack of circuit boards 404 in accordance with embodiments of the present invention can be formed to provide a desired number of beams or channels. In particular, the identical or substantially identical circuit boards 404a-i may be interconnected such that the second circuit board 404b is rotated 180° with respect to the first circuit board 404a, the third circuit board 404c is rotated 180° with respect to the second circuit board 404b (and therefore has the same alignment as the first circuit board 404a), and so on. Provided a suitable number of pass through channels are provided, scaling of the overall phased array antenna 104 can be achieved simply by selecting an appropriate number of phase shifter circuit boards 404. In accordance with other embodiments of the present invention, a number of circuit boards 404 may be configured such that they can be stacked without requiring that each board be rotated with respect to its neighboring boards.

Figure 8:
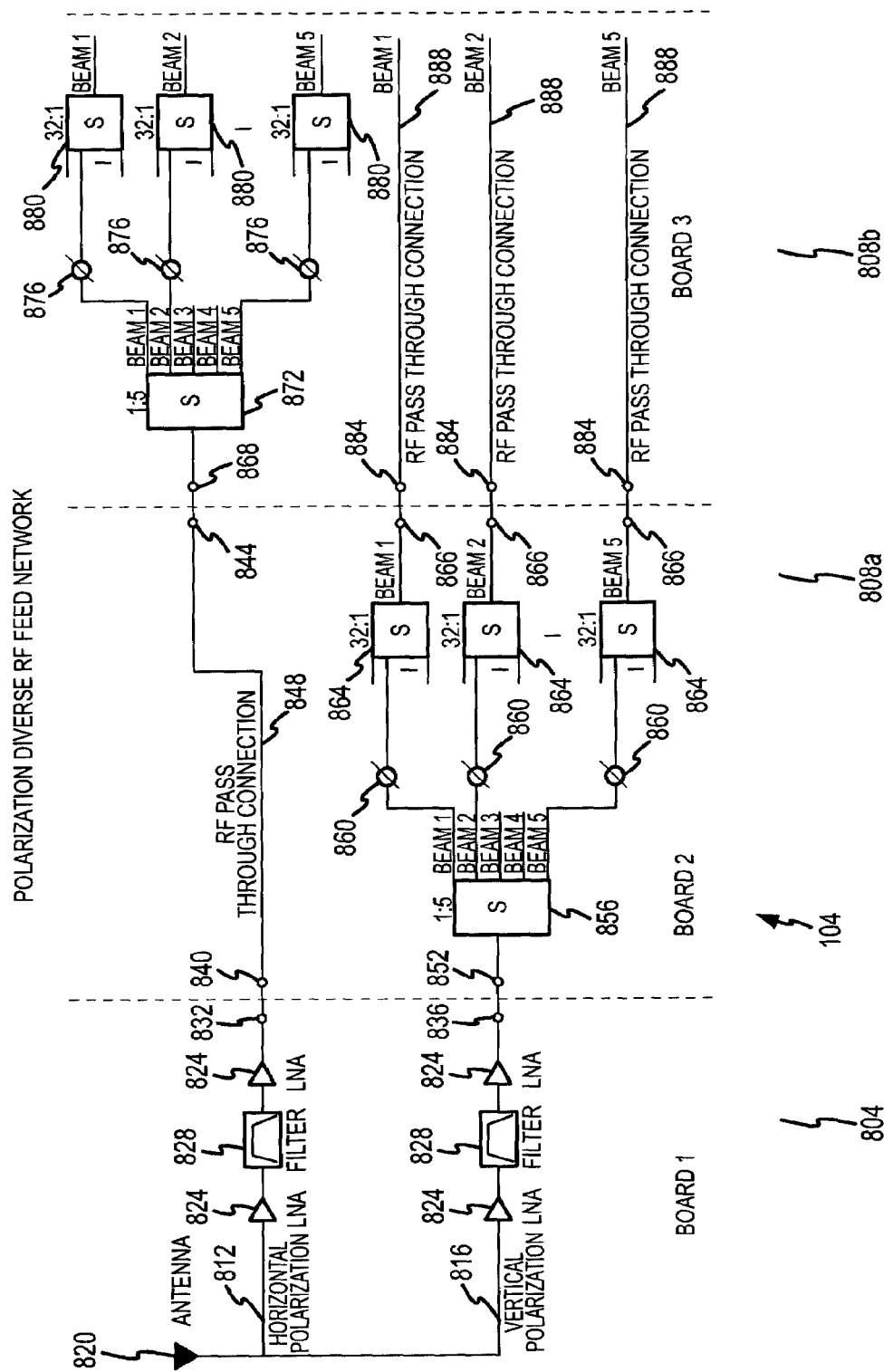
FIG. 8 is a schematic depiction of circuit elements in accordance with embodiments of the present invention that provide a polarization diverse radio frequency feed network.

As can be appreciated by one of skill in the art, it is often desirable to provide separate horizontally polarized and vertically polarized feeds in connection with antenna assemblies. With reference now to FIG. 8, circuit assemblies in accordance with embodiments of the present invention that provide a polarization diverse radio frequency feed network are schematically depicted. As shown in FIG. 8, the phased array antenna assembly 104 having a polarization diverse radio frequency feed network generally includes an antenna element circuit board 804 and a number of phase shifter circuit boards or elements 808.

The antenna element circuit board 804 generally includes horizontal 812 and vertical 816 antenna feeds for each radiator element 820. In addition, low noise amplifiers 824 and filters 828 may be associated with each of the antenna feeds 812, 816. A horizontally polarized signal connector 832 is associated with the horizontal polarization feed 812, and a vertically polarized signal connector 836 is associated with the vertical polarization feed 816.

The first beam forming network circuit board 808a includes a first pass through connector 840 on a first side 802 of the first phase shifter circuit board 808a for mating with the horizontally polarized signal connector 832. The first pass through connector 840 is interconnected to a second pass through connector 844 on a second side 806 of the board 808a by a pass through signal line 848. That is, the pass through signal line 848 carries a signal without introducing one of a plurality of selected phase shifts to a signal carried by that signal line 848. An additional connection 852 on a first side 802 of the first phase shifter circuit board 808a mates with the second connector 836 of the antenna element circuit board 804. The second connector 852 is in turn interconnected to a splitter 856 that distributes the vertical polarization signal between a number of phase shifters 860 that each form a beam of the antenna assembly 104. As can be appreciated by one of skill in the art, a phased array antenna includes multiple radiator elements 820. A combiner 864 may be provided for the signals comprising each beam of the antenna assembly 104 having a particular polarization, to combine the signals from different radiator elements 820. Each signal comprising a polarized beam of the antenna is then connected to a beam connector 866 on the second side 806 of the first phase shifter circuit board.

The second phase shifter circuit board 808b includes a connector 868 on a first side 802 for mating with the connector 844 of the first phase shifter circuit board 808a to receive the horizontally polarized signal 812. The horizontally polarized signal 812 is passed to a beam splitter 872, that divides the horizontally polarized signal 812 into a number of signals corresponding to the number of beams formed or supported by the second phase shifter circuit board 808b. Each of the beams is passed through a phase shifter 876. The phase shifters 876 are in turn interconnected to a combiner 880, to combine the signals from the different radiator elements 820. The second phase shifter board 808b additionally includes a number of connectors 884 and associated pass through signal lines 888 for passing the vertically polarized beams formed by the second phase shifter circuit board 808a on to a transceiver, either directly or across additional phase shifter circuit boards 808.

In accordance with embodiments of the present invention, the first phase shifter circuit board 808a may be identical to the second phase shifter circuit board 808b. Furthermore, it should be appreciated that the formation of beams may be distributed across a number of phase shifter circuit boards 808 in various ways. For example, instead of having all of the vertically polarized beams formed on one phase shifter circuit board 808 and all of the horizontally polarized signals formed on another phase shifter circuit board 808, the formation of horizontally polarized beams may be distributed among a number of printed circuit boards. Likewise, the formation of vertically polarized beams may be distributed among a number of printed circuit boards. As a further example, each printed circuit board 808 may form one or more horizontally polarized beams and also may form one or more vertically polarized beams.

Figure 9:
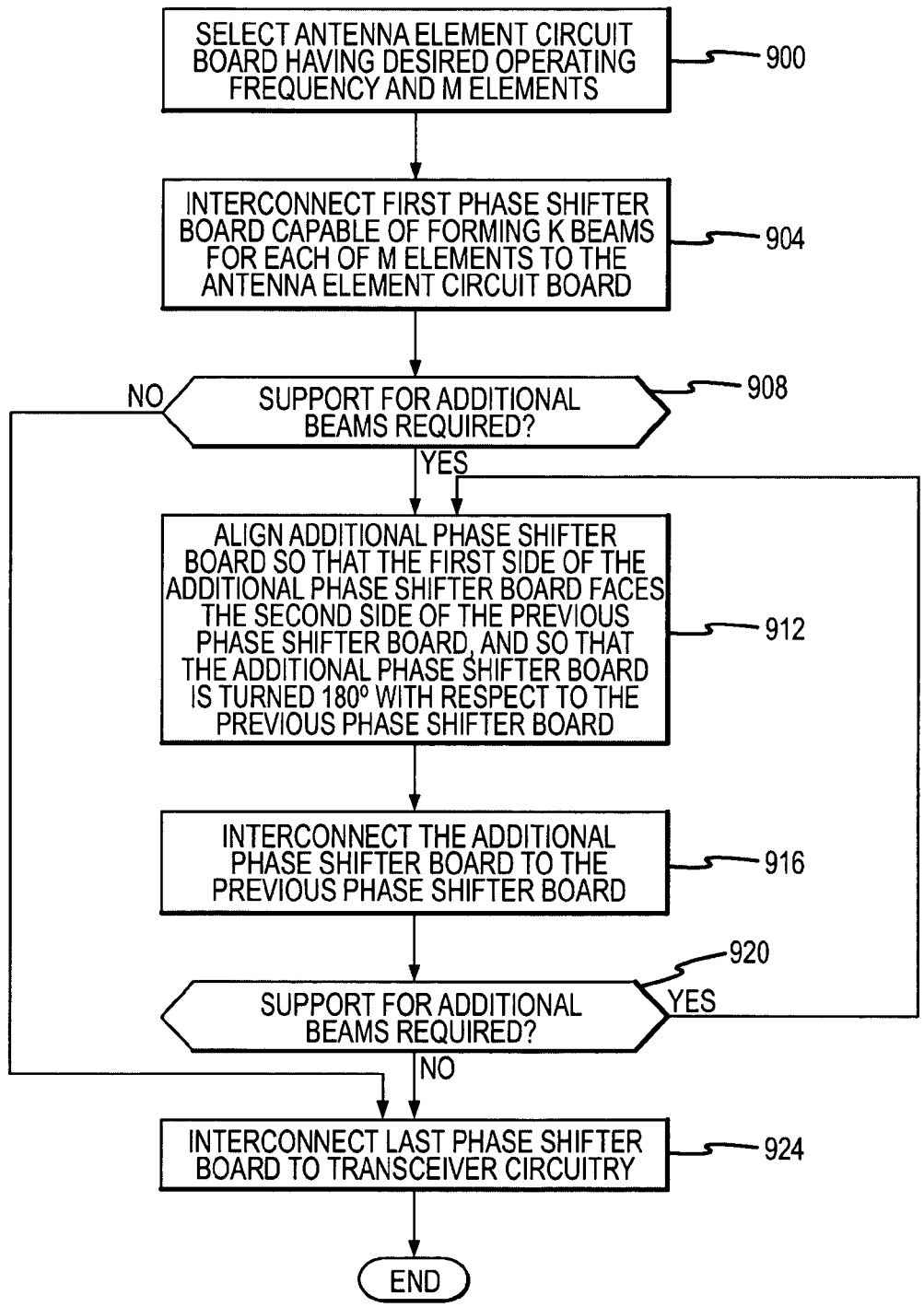
FIG. 9 is a flowchart depicting aspects of the creation of a phased array antenna using modular components in accordance with embodiments of the present invention.

With reference now to FIG. 9, aspects of the creation of a phased array antenna system 104 using modular components are illustrated. Initially, at step 900, an antenna element circuit board 204, 804 having m elements adapted for operating at a desired operating frequency is selected. Other considerations that can be taken into account in connection with selecting a suitable antenna element circuit board 204, 804 include the scanning range available, the available directivity, and whether the array is one or two dimensional.

At step 904, a first phase shifter board 404, 808 capable of forming k beams for each of the m antenna elements is interconnected to the antenna element circuit board 204, 804. In accordance with embodiments of the present invention, when the phase shifter circuit board 404, 808 is interconnected through an antenna element circuit board or element 204, 804, the first side of the phase shifter circuit board 404, 808 faces and is generally parallel to the second side of the antenna element circuit board 204, 804.

At step 908, a determination is made as to whether support for additional beams is required. If support for additional beams is required, an additional phase shifter board or element 404, 808 is aligned so that the first side of the additional phase shifter board faces the second side of the previous phase shifter board (step 912). In addition, in accordance with embodiments of the present invention, the additional phase shifter board is turned or rotated 180° with respect to the previous phase shifter board. In accordance with embodiments of the present invention, the additional phase shifter board is identical to the previous phase shifter board 404, 808. The additional phase shifter board 404, 808 is then interconnected to the previous phase shifter board 404, 808 (step 916).

At step 920, a determination may be made as to whether support for additional beams is required. If it is determined at either step 908 or step 920 that support for additional beams is not required, the last phase shifter board (i.e., the phase shifter board farthest from the antenna element circuit board 204, 804) is interconnected to transceiver circuitry (step 924). Such transceiver circuitry is, in accordance with embodiments of the present invention, at least partially formed on a circuit board that is generally parallel to the last phase shifter circuit board when interconnected to the last phase shifter circuit board. In accordance with still other embodiments of the present invention, the transceiver circuitry may be remote from the last phase shifter circuit board 404, 808.

As can be appreciated from the description provided herein, a phase shifting antenna 104 formed from modular components or elements as described herein comprises a stack of interconnected circuit boards. Furthermore, it can be appreciated that, in embodiments in which the stack comprises more than one phase shifter circuit board 404, 808, each circuit board forms less than all of the beams available in connection with the phased array antenna 104 of which the stack of phase shifter circuit boards 404, 808 is a part. It can further be appreciated that, in connection with polarization diverse phased array antennas 104, in embodiments incorporating more than one phase shifter circuit board, circuitry for providing the desired number of beams in each of the provided polarizations is divided among a number of circuit boards. In an additional aspect of embodiments of the present invention, even if a particular circuit board does not form a particular beam provided by the phase array antenna 104, a signal line for carrying that beam either before or after application of the associated phase delay for that beam by a component of another circuit board is provided.

In accordance with embodiments of the present invention, the various connectors 304, 420, 424, 504, 508, are selected to interconnect to form connector pairs. Accordingly, connectors 420, 424 on a first side of circuit elements or boards 404 may be configured to interconnect to connectors 304, 504, 508 on a second side of the various boards 204, 404. For example, connectors on a first side may comprise female coaxial connectors, while connectors on a second side may comprise male coaxial connectors.

It can further be appreciated from the description provided herein that embodiments of the present invention provide a modular architecture that allows circuit components to be replicated using a number of identical circuit boards that can be interconnected in selected numbers to support a selected number of channels. Although examples provided herein have discussed use of the modular architecture in connection with the formation of phased array antenna assemblies, it should be appreciated that embodiments of the present invention are not so limited. In particular, the modular architecture described herein can be used in connection with any circuit in which a number of instances of circuit components and/or features are required. Accordingly, a circuit board in accordance with embodiments of the present invention may provide a modification channel comprising components that perform functions other than phase shifting functions. Furthermore, it can be appreciated that components formed from an assemblage of modular components or circuit boards as described herein are capable of providing relatively compact circuitry featuring a number of substantially parallel, stacked circuit boards.

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with the various modifications required by their particular application or use of the invention. It is intended that the appended claims be construed to include alternative embodiments to the extent permitted by the prior art.

What is claimed is:

1. A modular electronic apparatus, comprising:
a first circuit board, said first circuit board including:
a number of first connectors on a first side of said first circuit board;
a number of first signal lines, wherein at least one of said first signal lines is interconnected to each of said first connectors;
a number of first devices for modifying or processing a signal, wherein at least one of said first devices is interconnected to one of said first signal lines;
a number of second signal lines; and
a number of second connectors on a second side of said first circuit board, wherein at least a first one of said second connectors is interconnected to at least a one of said first devices for modifying or processing a signal by a first one of said second signal lines, and wherein a second one of said second connectors is not interconnected to one of said first devices for modifying or processing a signal; and
a second circuit board interconnected to said first circuit board, said second printed circuit board including:
a number of first connectors on a first side of said second circuit board, wherein at least one of said first connectors is engaged with a corresponding one of said second connectors of said first circuit board;
a number of first signal lines, wherein at least one of said first signal lines is interconnected to each of said first connectors;
a number of first devices for modifying or processing a signal, wherein at least one of said first devices is interconnected to one of said first signal lines;
a number of second signal lines; and
a number of second connectors on a second side of said second circuit board, wherein at least a first one of said second connectors is interconnected to at least a one of said first devices for modifying or processing a signal by a first one of said second signal lines, and wherein a second one of said second connectors is not interconnected to one of said first devices for modifying or processing a signal; and
wherein said first and second printed circuit boards are substantially identical to one another.

2. The apparatus of claim 1, wherein said first circuit board further includes:
at least m first splitters, wherein one of said at least m first splitters is provided for each of said first signal lines to interconnect each of said first signal lines to k of said devices for modifying or processing a signal and to a one of said second connectors without passing through one of said first devices for modifying or processing a signal; and at least k second splitters, wherein each of said at least k second splitters is interconnected to m of said first devices for modifying or processing a signal.

3. The apparatus of claim 1, wherein at least one of said first and second sides of said first circuit board defines a first plane, and wherein at least one of said first and second sides of said second circuit board defines a second plane, and wherein said first and second planes are substantially parallel to one another.

4. The apparatus of claim 3, wherein said first and second circuit boards are aligned such that said second circuit board is rotated by 180 degrees within said second plane with respect to said first circuit board.

5. The apparatus of claim 3, further comprising a third circuit board, wherein said third circuit board is substantially identical to said first and second circuit boards, wherein said second connectors of said second circuit board are interconnected to first connectors of said third circuit board, wherein said first connectors of said first circuit board are aligned with said first connectors of said third circuit board along lines drawn through said first connectors of said first circuit board and perpendicular to a plane defined by said first side of said first circuit board, and wherein said second connectors of said first circuit board are aligned with second connectors of said third circuit board along lines drawn through said second connectors of said first circuit board and perpendicular to a plane defined by said first side of said first circuit board.

6. The apparatus of claim 1, wherein said first devices for modifying or processing a signal comprise phase shifters.

7. The apparatus of claim 1, wherein the apparatus comprises a modular antenna.

8. The apparatus of claim 7, further comprising:

a third circuit board, wherein said third circuit board includes a number of radiator elements, wherein said radiator elements occupy an area that is about equal to an area of said third circuit board.

9. A modular electronic architecture method, comprising:

providing a plurality of substantially identical planar circuit elements each having connectors on first and second sides;

orienting a first one of said planar circuit elements with respect to a second one of said planar circuit elements such that said second side of said first planar circuit element is facing and substantially parallel to said first side of said second planar circuit element;

interconnecting said first planar circuit element to said second planar circuit element, wherein at least two connectors on said second side of said first circuit element are interconnected to at least two connectors on said first side of said second circuit element to form at least two connector pairs;

receiving a first signal at a connector on said first side of said first circuit element;

splitting said first signal between a pass through channel and a modification channel on said first circuit element;

providing a first circuit component of a first type as part of said modification channel of said first circuit element;

modifying said first signal by said first circuit component of said first circuit element to form a first modified signal;

passing said first modified signal to said second circuit element using a first one of said connector pairs;

passing a signal carried by said pass through channel of said first circuit element to said second circuit element using a second one of said connector pairs, wherein said signal carried by said pass through channel is not modified by a circuit component of said first type on said first circuit element;

receiving said first modified signal at a connector on a first side of said second circuit element included in said first one of said connector pairs;

passing said first modified signal to one of said second connectors on said second side of said second circuit element, wherein said first modified signal is not modified by a circuit component of said first type on said second circuit element;

receiving a second signal comprising said signal carried by said pass through channel of said first circuit element at a connector on said first side of said second circuit element included in said second one of said connector pairs;

splitting said second signal between a pass through channel and a modification channel on said second circuit element;

providing a second circuit component of a first type as part of said modification channel of said second circuit element;

modifying said second signal by said second circuit component of said second circuit element to form a second modified signal;

passing said second modified signal to a connector on a second side of said second circuit element;

passing a signal carried by said pass through channel of said second circuit element to a connector on a second side of said second circuit element, wherein said signal carried by said pass through channel of said second circuit element is not modified by a circuit component of said first type on said second circuit element.

10. The method of claim 9, wherein said connector receiving said first signal on said first side of said first circuit element is aligned with said connector on said first side of said second circuit element included in said second one of said connector pairs along a line substantially perpendicular to said first side of said first circuit element.

11. The method of claim 9, wherein said modifying said first signal comprises introducing a selected phase shift of said first signal.

12. The method of claim 11, wherein said selected phase shift is selected from a number of predetermined phase shift amounts.

13. The method of claim 11, wherein said selected phase shift is selected from within a range of available phase shift amounts.

14. The method of claim 9, wherein said first signal is received from a signal line interconnected to an antenna element.

15. The method of claim 14, wherein an area of said first side of said first and second circuit elements is about equal to an area of a circuit board containing said antenna element.

16. The method of claim 9, wherein said first signal is received from a transceiver.

17. The method of claim 9, further comprising:

orienting a third one of said planar circuit elements with respect to said second one of said planar circuit elements such that said second side of said second planar circuit element is facing and substantially parallel to said first side of said third planar circuit element;

interconnecting said third planar circuit element to said second planar circuit element, wherein at least four connectors on said first side of said third circuit element are interconnected to at least four connectors on said second side of said second circuit element to form at least four connector pairs;

orienting a fourth one of said planar circuit elements with respect to said third one of said planar circuit elements such that said second side of said third planar circuit element is facing and substantially parallel to said first side of said fourth planar circuit element; and interconnecting said fourth planar circuit element to said third planar circuit element, wherein at least four connectors on said first side of said fourth circuit element are interconnected to at least four connectors on said second side of said third circuit element to form at least four connector pairs, wherein said first, second, third and fourth circuit elements form a circuit assembly that modifies a number of signals that is twice the number of signals modified by a circuit assembly including only first and second circuit elements.

18. A method for providing a scalable electronic assembly, comprising:

interconnecting a first modular circuit assembly to a second modular circuit assembly, wherein said first and second modular circuit assemblies are substantially identical to one another;

phase shifting a first signal in said first modular circuit assembly;

passing a second signal across said first modular circuit assembly without phase shifting said second signal, wherein said first signal is phase shifted by said first modular circuit assembly while said second signal is passed across said first circuit assembly without being phase shifted;

phase shifting said second signal in said second modular circuit assembly; and passing said phase shifted first signal across said second modular circuit assembly without further phase shifting said first signal, wherein said second signal is phase shifted by said second modular circuit assembly while said first signal is passed across said second circuit assembly without being further phase shifted;

wherein said first modular circuit assembly includes a first portion of a first circuit and a first portion of a second circuit, wherein said first portion of said first circuit and said first portion of said second circuit are not electrically connected to one another at any point on said first modular circuit assembly, wherein said second modular circuit assembly includes a second portion of said first circuit and a second portion of said second circuit, wherein said second portion of said first circuit and said second portion of said second circuit are not electrically connected to one another at any point on said second modular circuit assembly, wherein said first and second portions of said first circuit are electrically interconnected to one another by said interconnecting said first and second modular circuit assemblies, and wherein said first and second portions of said second circuit are electrically interconnected to one another by said interconnecting said first and second modular circuit assemblies.

* * * * *